(12) United States Patent
Cheng

(10) Patent No.: US 6,362,992 B1
(45) Date of Patent: Mar. 26, 2002

(54) BINARY-TERNARY CONTENT ADDRESSABLE MEMORY

(75) Inventor: Paul C. Cheng, San Jose, CA (US)

(73) Assignee: Purple Ray, Inc., Campbell, CA (US)

( * ) Notice: Subject to any disclaimer, the term of this patent is extended or adjusted under 35 U.S.C. 154(b) by 0 days.

(21) Appl. No.: 09/684,589

(22) Filed: Oct. 6, 2000

(51) Int. Cl.[7] ............................................. G11C 15/00

(52) U.S. Cl. ..................... 365/49; 365/189.07

(58) Field of Search ................... 711/108; 365/49, 365/189.07

(56) References Cited

U.S. PATENT DOCUMENTS

| | | | |
|---|---|---|---|
| 4,996,666 A | 2/1991 | Duluk, Jr. .................... | 365/49 |
| 5,010,516 A | 4/1991 | Oates .......................... | 365/49 |
| 5,072,422 A | 12/1991 | Rachels ....................... | 365/49 |
| 5,517,441 A | 5/1996 | Dietz et al. .................. | 365/49 |
| 5,940,852 A | 8/1999 | Rangasayee et al. ........ | 711/108 |
| 5,949,696 A | 9/1999 | Threewitt ..................... | 365/49 |
| 6,044,005 A | 3/2000 | Gibson et al. ................ | 364/49 |
| 6,061,262 A | 5/2000 | Schultz et al. ................ | 365/49 |
| 6,081,440 A | 6/2000 | Washburn et al. ............ | 365/49 |
| 6,101,116 A | 8/2000 | Lien et al. .................... | 365/49 |
| 6,108,227 A | 9/2000 | Voelkel ........................ | 365/49 |

OTHER PUBLICATIONS

"High Performance Search Engine", 1999, LNI7010, Lara Networks, (2 pages).
"High Performance Search Engine", 1999, LNI7020, Lara Networks, (2 pages).
"SiberCAM Application Note", 2/99, SiberCore Technologies, (2 pages).
"SCT2000", 2000, SiberCAM Ultra–2M, (2 pages).
"MU9C1965A/L LANCAM MP", Preliminary Data Sheet, Oct. 1, 1998, Music Semiconductors, (28 pages).
"MU9C4320L ATMCAM" data Sheet, Oct. 1, 1998, Music Semiconductors, (32 pages).

Primary Examiner—David L. Robertson
(74) Attorney, Agent, or Firm—Oppenheimer Wolff & Donnelly LLP; Raymond E. Roberts

(57) ABSTRACT

A binary-ternary configurable content addressable memory (CAM) (100). A plurality of CAM cells (114) including comparator logic cells (116) and paired storage locations (118, 118a, 118b) are directed by a signal at a mode terminal (120) to compare data provided at an input bus (110), either in binary mode against pre-stored content data or in ternary mode against pre-stored content and mask data. The comparator logic cells (116) generate respective bit signals (122) based on such comparison, and in this manner the plurality of CAM cells (114) may collectively be part of a CAM array block (104), which may optionally in turn work with a match detection block (106) to generate a match signal (126), and which may optionally in turn work with a priority encoder block (108) to generate a result signal at a result output (112).

14 Claims, 6 Drawing Sheets

Binary CAM (Exact Match)

| Address | Content |
|---|---|
| 0 | 1010 |
| 1 | 1010 |
| 2 | 1100 |
| 3 | 1000 |

Input: 1010 ➔ Output: 0 (multiple matches)
Input: 1100 ➔ Output: 2 (one match)
Input: 1001 ➔ Output: no match FIG. 1a (background art)

Ternary CAM (Longest Prefix Match)

| Address | Content | Mask |
|---|---|---|
| 0 | 1010 | 0000 |
| 1 | 1010 | 0001 |
| 2 | 1100 | 0000 |
| 3 | 1000 | 0001 |

Input: 1010 ➔ Output: 0 (multiple matches)
Input: 1100 ➔ Output: 2 (one match)
Input: 1001 ➔ Output: 3 (one match)
Input: 1101 ➔ Output: no match FIG. 1b (background art)

BINARY-TERNARY CONTENT ADDRESSABLE MEMORY

TECHNICAL FIELD

The present invention relates generally to static information storage and retrieval systems, and more particularly to associative memories, which are also referred to as content or tag memories.

BACKGROUND ART

Many real world applications today require searching information at high speed. In particular, as network-systems proliferate in which data packets are transferred based on the contents of address information contained there in, it is increasingly desirable to perform very high speed comparisons to deliver such data packets ("routing" and "switching" are the terms particularly used in the network field). This has motivated the network industry to turn to hardware solutions, including a class of circuits known as "content addressable memories" (CAM). The following discussion will generally use this example of packet routing and switching in networks, although many other applications also exist where high speed searching is desirable, and where the present invention may be useful.

The data packet routing and switching in networks generally employs a matching function, wherein a header field in the data packet is compared to a number of table entries. There are basically two types of information search which are of interest in this role, exact match search and partial match search.

For these two types of information searching two types of CAMs are available. Binary CAM can only be used for exact match search applications. Ternary CAM, on the other hand, can be configured and used for exact match and partial match search applications.

To some extent, CAM can be compared to more widely known random access memories (RAM). CAM cells must be both readable and writable, just like RAM cells. However, CAM operates in the converse way that RAM operates. In a RAM, the input is an address and the output is the data stored at that address. In a CAM, the input is a data sample and the output is a flag to indicate a match, as well as an address of matching data.

For example, a typical unit today is a 128 bit by 1024 (or 1K) CAM, which can be used to compare a 128 bit data sample against a "database" of 1024 potential matches. The time period required for this is inherently short and is generally consistent despite the database size, ignoring extrinsic factors. It is this ability which CAMs provide to quickly search wide data words against large address spaces (databases) which makes them highly useful.

FIGS. 1a and 1b (background art) summarize examples of logic operation in binary and ternary CAM, respectively. In FIG. 1a, a binary CAM unit has the content of 1010 stored at address 0; the content of 1010 also stored at address 1; the content of 1100 stored at address 2; and the content of 1000 stored at address 3. If the data 1010 is input to this binary CAM, a flag indicates a match and an output of 0 is generated, indicating the first match address. If the data 1100 is input to this CAM, the flag again indicates a match and an output of 2 is generated, indicating the only match address this time. Finally, if the data 1001 is input, the flag does not indicate a match (any output should be ignored). In this example there will never be a output of 1, since we are presuming a prioritization which provides the lowest matching address.

In FIG. 1b, a ternary CAM unit has the content of 1010 with the mask 0000 stored at address 0; the content of 1010 with the mask 0001 stored at address 1; the content of 1100 with the mask 0000 stored at address 2; and the content of 1000 with the mask 0001 stored at address 3. If the data 1010 is input to this CAM, a flag indicates a match and an output of 0 is generated, indicating the first match address (again prioritized). If the data 1100 is input to this CAM, the flag again indicates a match and an output of 2 is generated, indicating the (only) match address. However, if the data 1001 is input to this ternary CAM, the flag indicates a match and an output of 3 is generated. This occurs because the mask here has filtered the last bit of the content—with this content and mask data of either 1000 or 1001 this same result would be produced. Continuing, if the data 1101 is input to this ternary CAM, the flag here will not indicate a match.

In the above ternary CAM example there could potentially be a valid address output of 1. This would occur if the data 1011 were input. Also, in this ternary CAM example longest prefix type masks have been used. Such longest prefix masking is particularly useful in modern network routing and switching schemes, where the leading bits, or prefixes, of addresses are often all that is important in routing and switching.

FIG. 2 (background art) is a block diagram which stylistically depicts how a typical CAM unit 10 contains three logic blocks 12: a CAM array block 14, a match detection block 16, and a priority encoder block 18. A data input 20 and a result output 22 complete this simple representation.

The CAM array block 14 contains CAM cells and comparison logics, discussed presently, which receive a signal for comparison with a signal at the data input 20. The match detection block 16 contains logics to generate a match signal for each CAM entry. The priority encoder block 18 takes in the match signals (from the match detection block 16) and outputs the address of the highest priority matched entry, as a signal at the result output 22.

FIG. 3 (background art) is a block diagram which stylistically depicts how a typical binary CAM unit 30 includes three major logic blocks 32 (analogous to the logic blocks 12 of FIG. 2), and which particularly depicts the details of a CAM array block 34 and a match detection block 36. A priority encoder block 38 is also shown here, but not depicted in detail since it may be conventional (or even omitted). Finally, an input bus 40 (analogous to the simplified data input 20 of FIG. 2) and a result output 42 are also provided.

The binary CAM array block 34 contains many binary CAM cells 44. Each such binary CAM cell 44 typically consists of a comparator logic cell 46 and a content location 48, typically equivalent to a SRAM bit. All of the content locations 48 have entry data bits stored in them before the binary CAM unit 30 is used. The data to be searched ("compared" or "matched") may then be provided on the input bus 40 (here extending from B0 to Bn). The unit data searched in a CAM is often referred to as a "word," although this comparand data may be much longer than an 8-bit word, e.g., 32 bits or 128 bits are typical in current commercially available CAMs.

The comparator logic cell 46 basically compares the data on the input bus 40 with the data pre-stored in the content location 48, and then outputs a bit signal 52. FIG. 3a (background art) depicts a simplified gate logic equivalent of the comparator logic cell 46. The bit signal 52 is a 1 if the data are the same or a 0 if they are different (in principal, the logical inverse of an exclusive OR logic). In actual practice, say, at an integrated circuit die level other gate logic may be used or semiconductors may be employed in manners which blur distinction between individual logical units and thus may not form distinct "gates." Accordingly, this is a conceptual representation, which skilled in the art will appreciate may be implemented in many different manners.

Returning to FIG. 3, all of the respective bit signals 52 output from the comparator logic cells 46, in a respective entry (row), go to the match detection block 36. The match detection block 36 includes a series of AND gates 54, one per respective entry (row) in the CAM. All of the bit signals 52 for a respective entry (row) are directed to one such AND gate 54, and if all of the respective bit signals 52 are true (all 1's) the AND gate 54 generates a respective match signal 56. Again, this also is a conceptual representation of what may be employed in actuality.

These match signals 56, from the match detection block 36, then collectively go to the priority encoder block 38, where the result output 42 is generated. The priority encoder block 38 may be considered optional, theoretically, although one is almost always present, either integral to the CAM unit itself or in some form of external circuitry. The priority encoder block 38 addresses the situation when more than one AND gate 54 generates a match signal 56, i.e. when more than one entry is flagged as indicating a match. As noted previously, the purpose of a CAM includes providing an address of matching data. Thus, the signal at the result output 42 contains both a flag indicating whether a match occurred, as well as the address of one such match, if any matches occurred. Just one such address for matching data is included in the signal generated at the result output 42, based upon prioritization using a pre-set rule. For example, if multiple matches occur, the lowest match address may be used, the highest match address may be used, a randomly chosen match address may be used, etc. The prioritization rule is a matter of design choice.

Some liberties have been taken above to emphasize the salient aspects of CAM operation. In FIG. 3 the circuitry used for writing entries, i.e., the content locations 48 of the binary CAM unit 30, has been omitted. Also, most CAM today employs gate circuitry to control how the data is provided on the input bus 40. This has likewise been omitted. The match detection block 36 has also been described as using AND circuitry, but those skilled in the electronic arts will readily appreciate that other gate logic may be used instead. Furthermore, the priority encoder block 38 has been described only in general concept. This is because such other details are not germane to the present topic of binary verse ternary CAM, or generally to the present invention.

FIG. 4 (background art) is a block diagram which stylistically depicts how a typical ternary CAM unit 70 includes three major logic blocks 72 (analogous to the logic blocks 12 of FIG. 2), and which particularly depicts the details of a CAM array block 74 and a match detection block 76. A priority encoder block 78 is also shown here, but not depicted in detail since, as described above for binary CAMs, it may be conventional (or even omitted). Finally, an input bus 80 and a result output 82 are also provided.

The ternary CAM array block 74 contains many ternary CAM cells 84. Each such ternary CAM cell 84 typically consists of a comparator logic cell 86, as well as a content location 88 and a mask location 90, typically equivalent to two SRAM bits.

All of the content locations 88 have entry data stored in them before the ternary CAM unit 70 is used. Similarly, all of the mask locations 90 must have mask data stored in them. The data to be searched (compared) may then be provided on the input bus 80 (here extending from B0 to Bn).

The comparator logic cell 86 basically compares the data on the an input bus 80 with the data pre-stored in the content location 88 and the mask location 90 and then outputs a bit signal 92. FIG. 4a (background art) depicts a simplified gate logic equivalent of the comparator logic cell 86. Here also, in actual practice other gate logic or semiconductor-die implementations not even forming distinct gates may alternately be used.

Returning to FIG. 4, when not masked by a 1 in the mask location 90, the comparator logic cell 86 basically compares the data on the input bus 80 with the data pre-stored in the content location 88, just like the binary CAM array block 34 does (FIG. 3), and the comparator logic cell 86 outputs a bit signal 92 which is a 1 if the data are the same or a 0 if they are different. In contrast, when masked, the comparator logic cell 86 will always output the bit signal 92 as a 1. All of the respective bit signals 92 output from the comparator logic cells 86, in a respective entry (row), go to the match detection block 76.

The match detection block 76 includes a series of AND gates 94, one per respective entry (row) in the CAM. All of the bit signals 92 for a respective entry (row) are directed to one such AND gate 94, and if all of the respective bit signals 92 are true (all 1's) the AND gate 94 generates a respective match signal 96.

It should be noted that the operations of the match detection block 76 and the priority encoder block 78 are essentially the same as for their equivalents in the binary CAM unit 30 of FIG. 3. What are depicted here are conceptual representations of what may be employed in actuality.

As described above with respect particularly to FIG. 3, in present binary CAM units each cell contains only one bit of information, the content location 48. This bit of information can be implemented using essentially any memory technology existing today, such as SRAM, DRAM, ROM, flash memory, etc. In contrast, as described above with respect particularly to FIG. 4, the cells in each ternary CAM unit contain two bits of information, both the content location 88 and the mask location 90. These two bits of information in ternary CAM cells can also be implemented using essentially any conventional memory technology.

Today binary and ternary CAM are discrete component types, typically implemented as integrated circuits, although discrete component implementations are still occasionally encountered. Most, if not all, CAM manufacturers presently supply only ternary CAM products, despite their lower "density." This is because ternary CAM can also be used, interchangeably as binary CAM (e.g., by setting the mask locations 90 all to 0's). The drawback to this, however, is that when ternary CAM is used as binary CAM all of the mask locations must be set to an off state, and hence half of the storage locations on a die are effectively wasted.

The use of ternary CAM as binary CAM is obviously not an efficient use of resources. A more desirable situation is to employ a CAM which is configurable, as either binary or ternary CAM, but which is efficient and fully utilizes all memory cells be in either mode. Unfortunately, until the advent of the present invention this more desirable solution has not been accomplished. The following discussion of some key prior art serves to illustrate this.

U.S. Pat. No. 6,108,227 by Vokel teaches a CAM in which the CAM cells are switchable between binary and ternary modes of operation by the use of a variable impedance path. This CAM can be particularly used interchangeably in both binary and ternary CAM modes, due to the improvement of a variable impedance path controlling the mode change. But this advancement in the art does not efficiently use all memory cells in either mode, it follows conventional practice and merely sets the mask locations to an off state when the ternary CAM is used in binary mode.

U.S. Pat. No. 6,044,005 by Gibson et al. also teaches CAM in which the CAM cells are switchable between binary and ternary modes of operation, but here particular gating and a reduced match line power dissipation facilitating the construction of large-capacity CAM arrays are provided. This therefore also follows conventional practice in the art, and does not efficiently use all of the available memory cells when the ternary CAM is used in binary mode.

Examples of other CAM related references which show the history and the general present state of the art include: U.S. Pat. No. 6,081,440 by Washburn et al. which teaches a ternary CAM having a massive parallel shift capability; U.S. Pat. No. 6,101,116 by Lien et al. which teaches a six-transistor CAM cell that prevents write operation disruption of non-written row contents; U.S. Pat. No. 6,061,262 by Schultz et al. which teaches a large-capacity CAM in which random access memory (RAM) core cells are used to store the CAM data; U.S. Pat. No. 5,940,852 by Rangasayee et al. which teaches a programmable logic device in which dual-mode memory is operable as a CAM or a RAM; U.S. Pat. No. 5,949,696 by Threewitt which teaches a three-state CAM cell with a comparison element for speed network address filtering; U.S. Pat. No. 5,517,441 by Dietz et al. which teaches a CAM in which faster comparisons are achieved by staggering the availability of information for comparison; U.S. Pat. No. 5,072,422 by Rachels which teaches a CAM having a plurality of word cells with logic enabling independent parallel operation of each word cell; U.S. Pat. No. 5,010,516 by Oates which teaches a CAM implemented with a plurality of integrated circuits; and U.S. Pat. No. 4,996,666 by Duluk Jr. which teaches an exemplary early CAM implementation.

Accordingly, what is needed is a design for an efficient and configurable binary-ternary CAM (BT-CAM), where all of the cells in can be fully utilized regardless of the configuration of the CAM.

DISCLOSURE OF INVENTION

Accordingly, it is an object of the present invention to provide a CAM which is configurable to operate in either binary mode or ternary mode, yet which is efficiently able to utilize all memory cells in either mode.

Briefly, a first preferred embodiment of the present invention is a content addressable memory (CAM) cell. A first storage location is provided into which a content bit can be stored, and a second storage location is provided into which either a content bit or a mask bit can be stored. A comparator logic cell is connected to each of a mode terminal, two input lines, and the first and second storage locations. When operation of the CAM cell in a binary mode is requested via the mode terminal, the comparator logic cell generates a bit signal based on comparison in two-bit binary manner of two data bits, respectively received on the input lines, and the content bits in each of the storage locations. Alternately, when operation of the CAM cell in a ternary mode is requested via the mode terminal, the comparator logic cell generates the bit signal based on comparison in one-bit ternary manner of one data bit, received on one of the input lines, with the content bit in the first storage location and using the mask bit in the second storage location.

Briefly, a second preferred embodiment of the present invention is a content addressable memory (CAM). An input bus is provided to receive a data signal including a plurality of data bits into an array block having a plurality of CAM cells. The CAM cells each include a first storage location into which a content bit can be stored and a second storage location into which either a content bit or a mask bit can be stored. Also included is a comparator logic cell which is connected to the input bus and the storage locations. The comparator logic cell is able to generate a bit signal based on comparison in two-bit binary manner of two of the data bits with the content bits respectively in each of the storage locations, when operation is desired in a binary mode. Alternately, the comparator logic cell are able to generate the bit signal based on comparison in one-bit ternary manner of one data bit with the content bit in the first storage location and the mask bit in the second storage location, when operation is desired in a ternary mode. A match detection block receives the bit signals from the array block and generates there from a plurality of match signals. A priority encoder block receives the plurality of match signals and generates there from a result signal at a result output.

Briefly, a third preferred embodiment of the present invention is a method for operating a content addressable memory (CAM) configurably in either of binary or ternary operation modes. A mode signal is received indicating which of the binary or the ternary operation modes is desired. When the mode signal indicates the binary operation mode is desired, a first data bit and a second data bit are received from a data signal and respectively compared to a first-part content bit previously stored in said first storage location and to a second-part content bit previously stored in said second storage location, thereby performing a two-bit binary comparison. A bit signal based is then generated based on this two-bit binary comparison. Alternately, when the mode signal indicates the ternary operation mode is desired, only the first data bit is received from the data signal and compared to a content bit previously stored in the first storage location. This is done based on a mask bit previously stored in the second storage location, thereby instead performing a one-bit ternary comparison. The bit signal is then generated based on this one-bit ternary comparison.

An advantage of the present invention is that it provides a general purpose CAM that may be used in either binary or ternary modes, thus eliminating the potential need for distinct parts that can operate in each mode or resorting to the use of a ternary CAM in an equivalent-binary manner.

Another advantage of the invention is that it provides a CAM which utilizes memory cells in a maximally efficient manner in both binary and ternary modes, thus providing a CAM with highest possible effective cell density in either mode.

And another advantage of the invention is that it provides a CAM which may be implement in as little as a single integrated circuit, which may be pin configurable to operate in either of binary or ternary modes, and which need not waste any die space or energy on inoperable cells when the CAM is used in binary mode.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended drawings in which:

FIGS. 1a and 1b (background art) summarize respective examples of logic operation in a binary CAM and a ternary CAM;

BEST MODE FOR CARRYING OUT THE INVENTION

Figure 2:
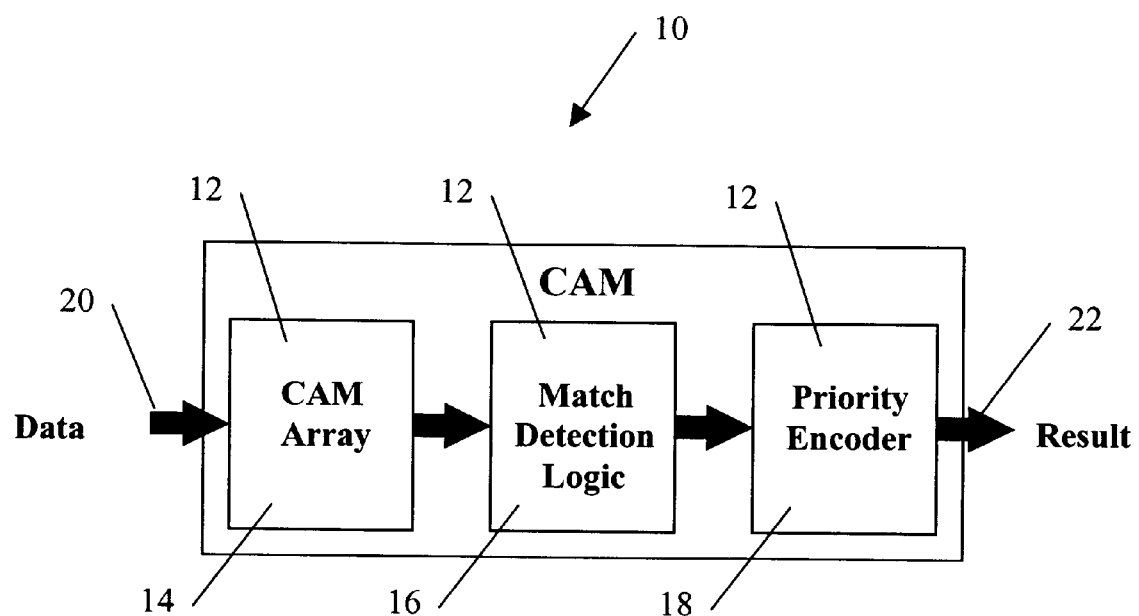
FIG. 2 (background art) is a block diagram which depicts how a typical CAM unit contains three major logic blocks.

A preferred embodiment of the present invention is a binary-ternary content addressable memory (BT-CAM). As illustrated in the various drawings herein, and particularly in the view of FIG. 5, a preferred embodiment of the inventive device is depicted by the general reference character 100.

Figure 5:
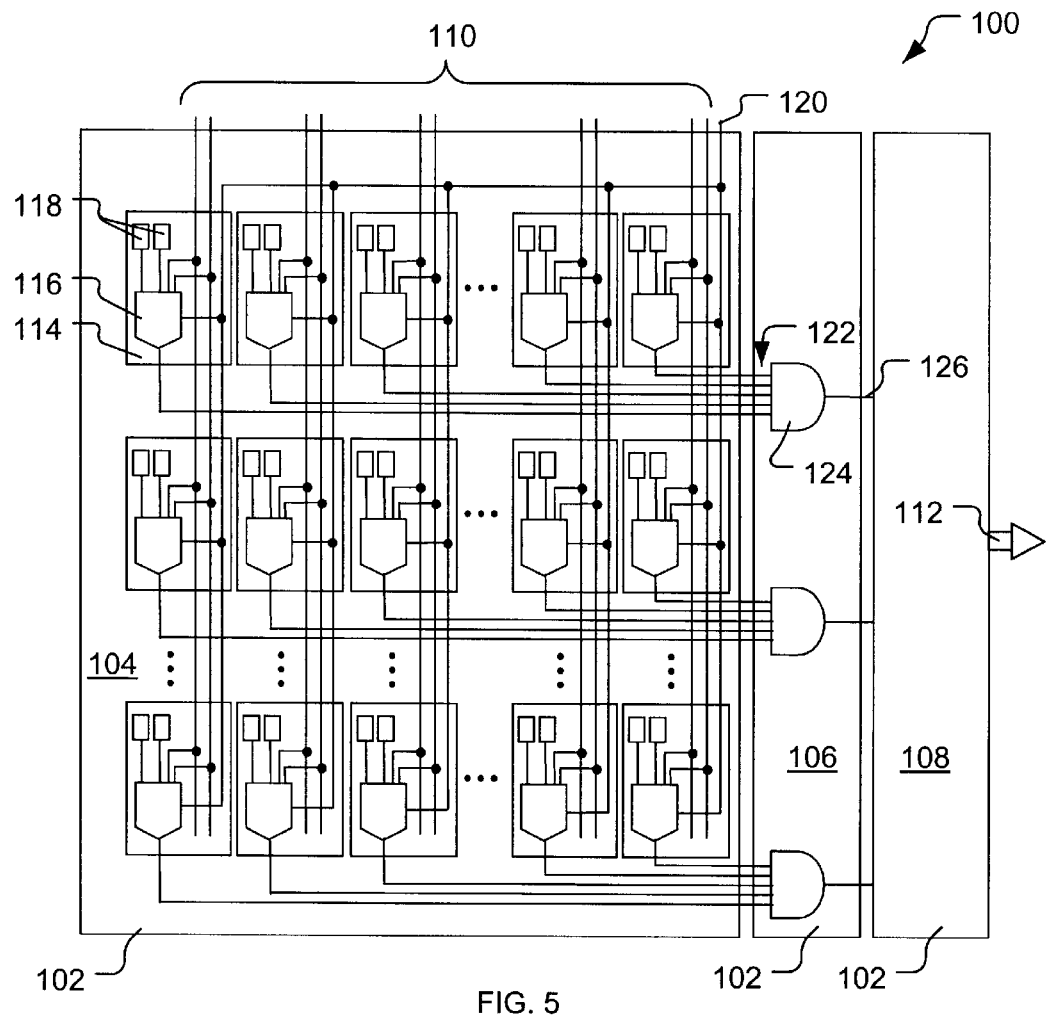
FIG. 5 is a block diagram which depicts a binary-ternary CAM unit according to the present invention.

FIG. 5 is a block diagram which stylistically depicts a BT-CAM unit 100 according to the present invention. This preferred embodiment includes three major logic blocks 102 (analogous to the logic blocks 12 of FIG. 2 (background art)). The logic blocks 102 are: a CAM array block 104, a match detection block 106, and a priority encoder block 108. Also provided are an input bus 110 (analogous to the simplified data input 20 of FIG. 2) and a result output 112.

In FIG. 5 details within the CAM array block 104 are emphasized, as this is particularly where the key inventive aspects of the BT-CAM unit 100 are implemented. The match detection block 106, the priority encoder block 108, and most other elements of the BT-CAM unit 100 may be essentially conventional.

The data (comparand) to be searched (compared) is provided on the input bus 110 (B0 to Bn), but with a distinction depending on whether the BT-CAM unit 100 is configured in binary or ternary mode. A match flag and a match address (if at least one match occurs), are generated as part of a signal at the result output 112.

The CAM array block 104 contains many BT-CAM cells 114. Each such BT-CAM cell 114 consists of a comparator logic cell 116 and two storage locations 118. These two storage locations 118 can be used as two content locations if the BT-CAM cell 114 is configured to be a binary CAM cell. Or they can be used as one content location and a mask location if the BT-CAM cell 114 is configured to be a ternary CAM cell.

Figure 3:
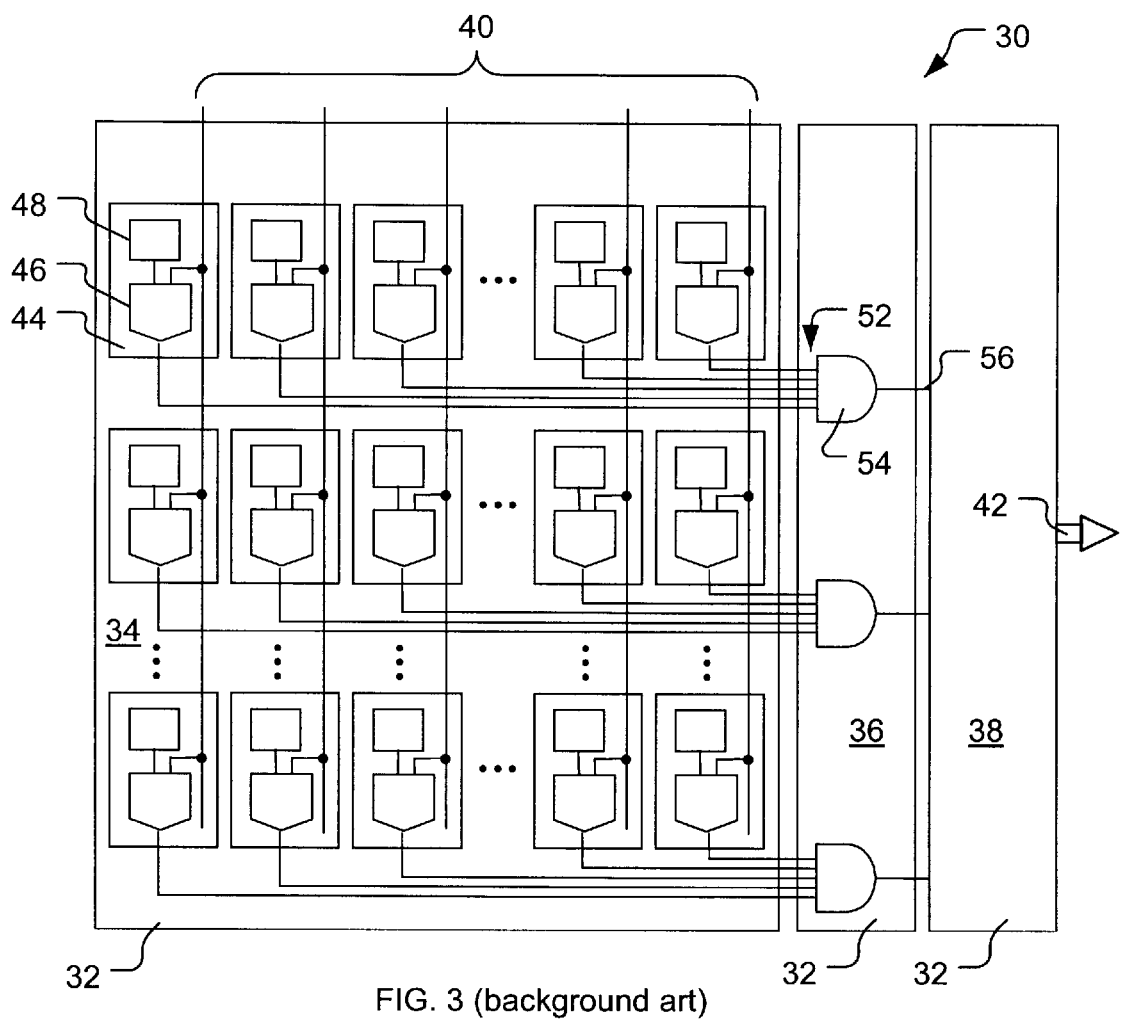
FIG. 3 (background art) is a block diagram which depicts a typical binary CAM unit.
Figure 3A:
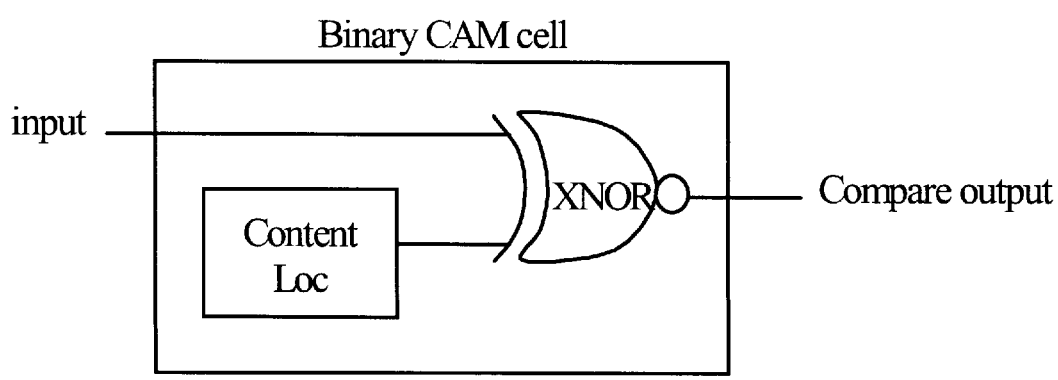
FIG. 3a (background art) is a block diagram of a simplified gate logic equivalent of the comparator logic cells of FIG. 3.
Figure 4:
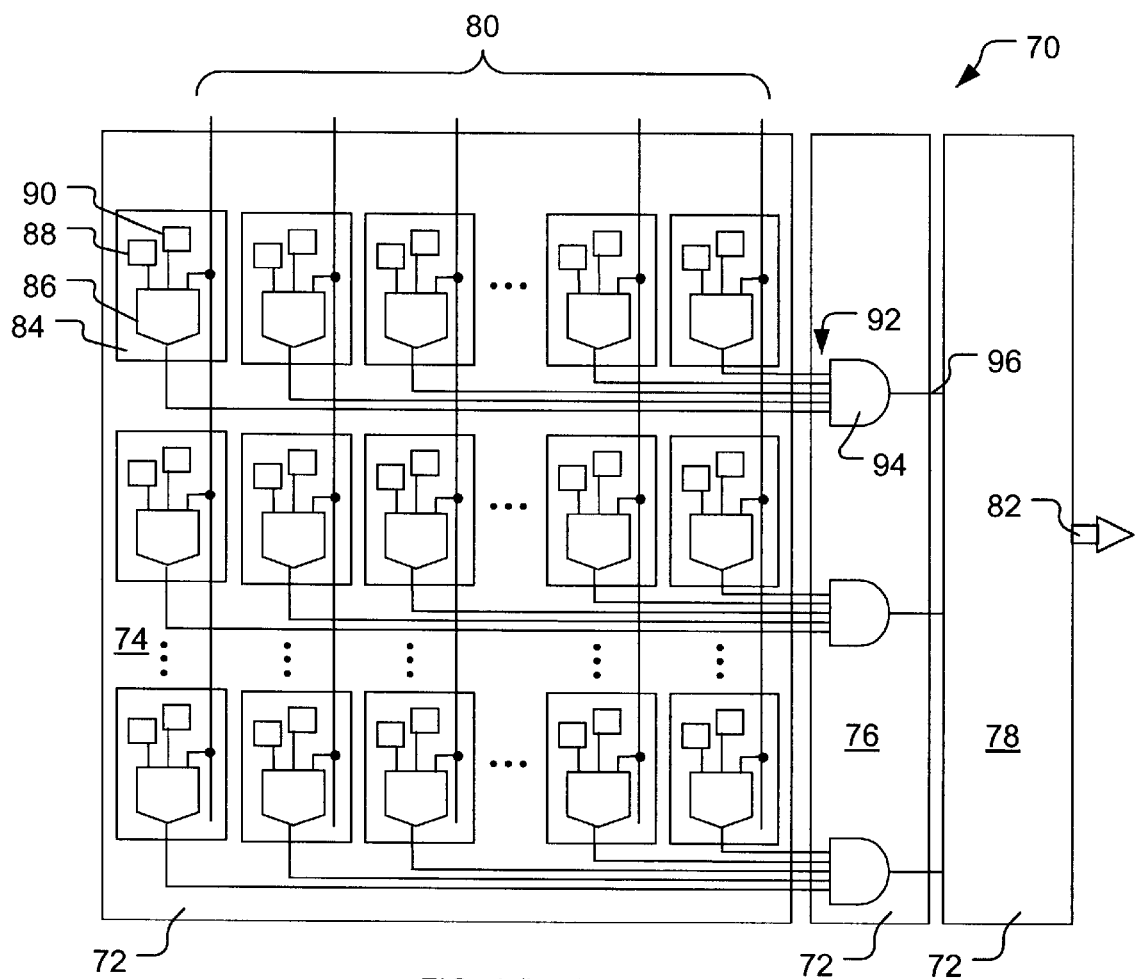
FIG. 4 (background art) is a block diagram which depicts a typical ternary CAM unit.
Figure 4A:
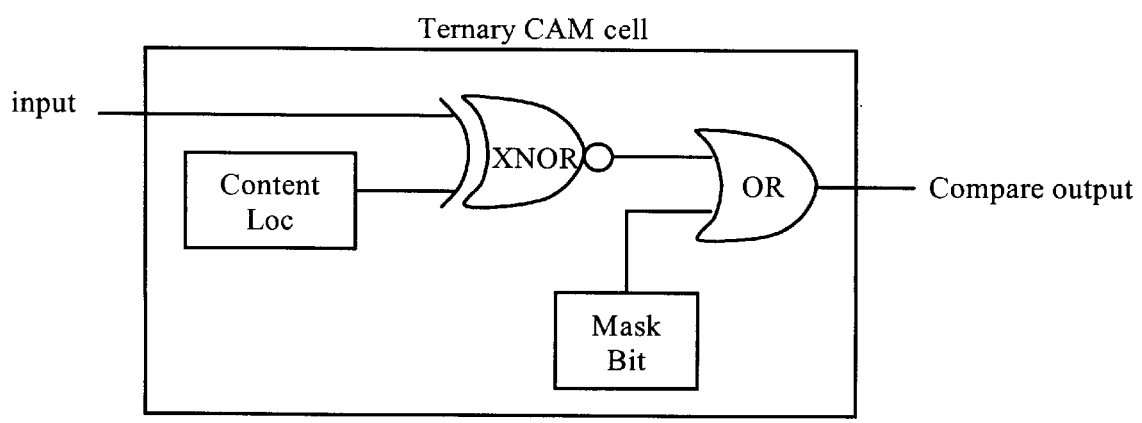
FIG. 4a (background art) is a block diagram of a simplified gate logic equivalent of the comparator logic cells of FIG. 4.
Figure 5A:
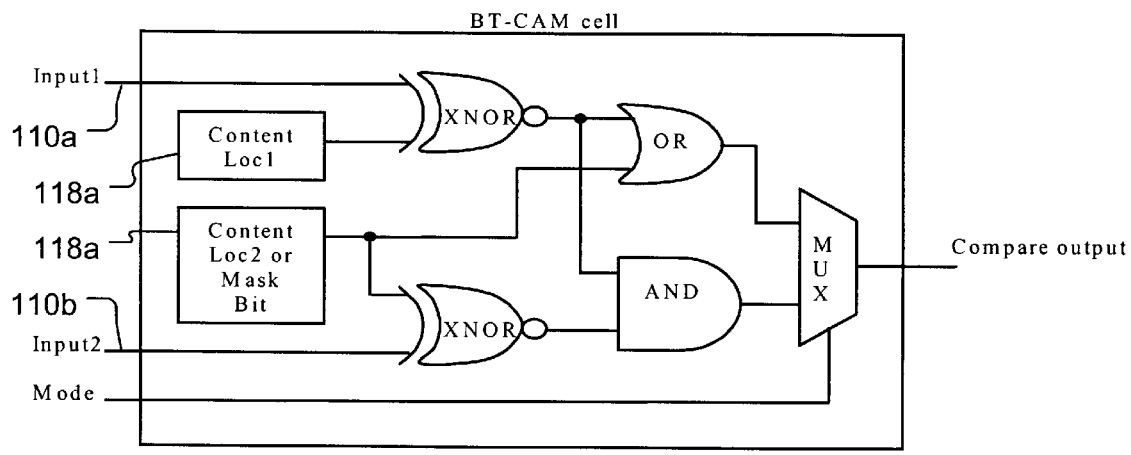
FIGS. 5a is a block diagram of a simplified gate logic equivalent of the comparator logic cells of FIG. 5.

FIG. 5a depicts a simplified gate logic equivalent of the comparator logic cell 116. As was noted above with respect background art comparator logic cells 46, 86 (FIGS. 3a and 4a), those skilled in the art will readily appreciate that other gate logic or semiconductor-die implementations not even forming distinct gates may be used in equivalent embodiments.

In FIGS. 5 and 5a, two particular storage locations 118 are further shown respectively as a storage location 118a and a storage location 118b and two particular elements of the input bus 110 are shown as an input line 110a and an input line 110b.

The comparator logic cell 116 acts as a two-bit binary-CAM-cell comparator or a one-bit ternary-CAM-cell comparator, based upon a signal provided at a mode terminal 120. The output of each comparator logic cell 116 is a respective bit signal 122.

If the BT-CAM unit 100 is configured to be a binary CAM, say, by the mode terminal 120 being in an off state, the data to be searched is provided on the input bus 110 with one-to-one correspondence. That is with the relevant two elements of the input bus 110, say, input lines 110a, 110b, each respectively receiving a different data bit for comparison. The first data bit, provided at the input line 110a, is compared with the pre-stored contents of the storage location 118a and the second data bit, provided at the input line 110b, is compared with the pre-stored contents of the storage location 118b. If the comparisons are the same, the comparator logic cell 116 generates the bit signal 122 to include a 1, indicating a complete match. Otherwise it generates a 0.

In contrast, if the BT-CAM unit 100 is configured to be used as a ternary CAM, by the appropriate signal at the mode terminal 120, the data to be searched is provided on the input bus 110 with a one-to-two correspondence. That is with only input line 110a receiving the data bit for comparison and the other (input line 10b) not being employed. Now the pre-stored contents of the storage location 118a are the content against which the data bit at input line 110a is compared, and the pre-stored contents of the storage location 118b are the mask used during this comparison. The comparator logic cell 116 performs this comparison much same as its equivalent in a conventional ternary CAM (ignoring the unused input line 110b). It generates a 1 in the bit signal 122 if the storage location 118b (mask) contains a 1; it generates a 1 in the bit signal 122 if the storage location 118a and the data bit at input line 110a are the same, both 1's or 0's; and it generates a 0 in the bit signal 122 if the storage location 118a and the data bit at input line 110a are not the same.

Returning now to just FIG. 5, in conventional manner, as previously described, the match detection block 106 includes the gate logic equivalent of a series of AND gates 124, one per respective entry (row) in the CAM. All of the bit signals 122 for a respective entry (row) are directed to one such AND gate 124, and if all of the respective bit signals 122 are true (all 1's) the AND gate 124 generates a respective match signal 126 for that entry (row).

These match signals 126, from the match detection block 106, then collectively go to the priority encoder block 108, where the result output 112 is generated. The priority encoder block 108 may be optional, theoretically, but one will usually be present, either integral to the CAM unit itself or in some form of external circuitry. In conventional manner, as previously described, the priority encoder block 108 addresses the situation when more than one AND gate 124 generates a match signal 126, i.e. when more than one entry is flagged as indicating a match. When more than one such match is present it is the particular function of the priority encoder block 108 to provide in the result output 112 just one address for matching data, based upon prioritization using a pre-set rule.

Some conventional features have been omitted from FIG. 5, to prevent their obscuring the key inventive aspects being discussed. For example, circuitry used for writing entries, i.e., the content bits and mask bits into the storage locations 118 has been omitted. Also, most CAM today employs gate circuitry to configurably control how the data (comparand) is provided on the input bus 110. Such conventional details are not germane to the present topic of binary verse ternary CAM, or generally to the present invention.

Figure 6:
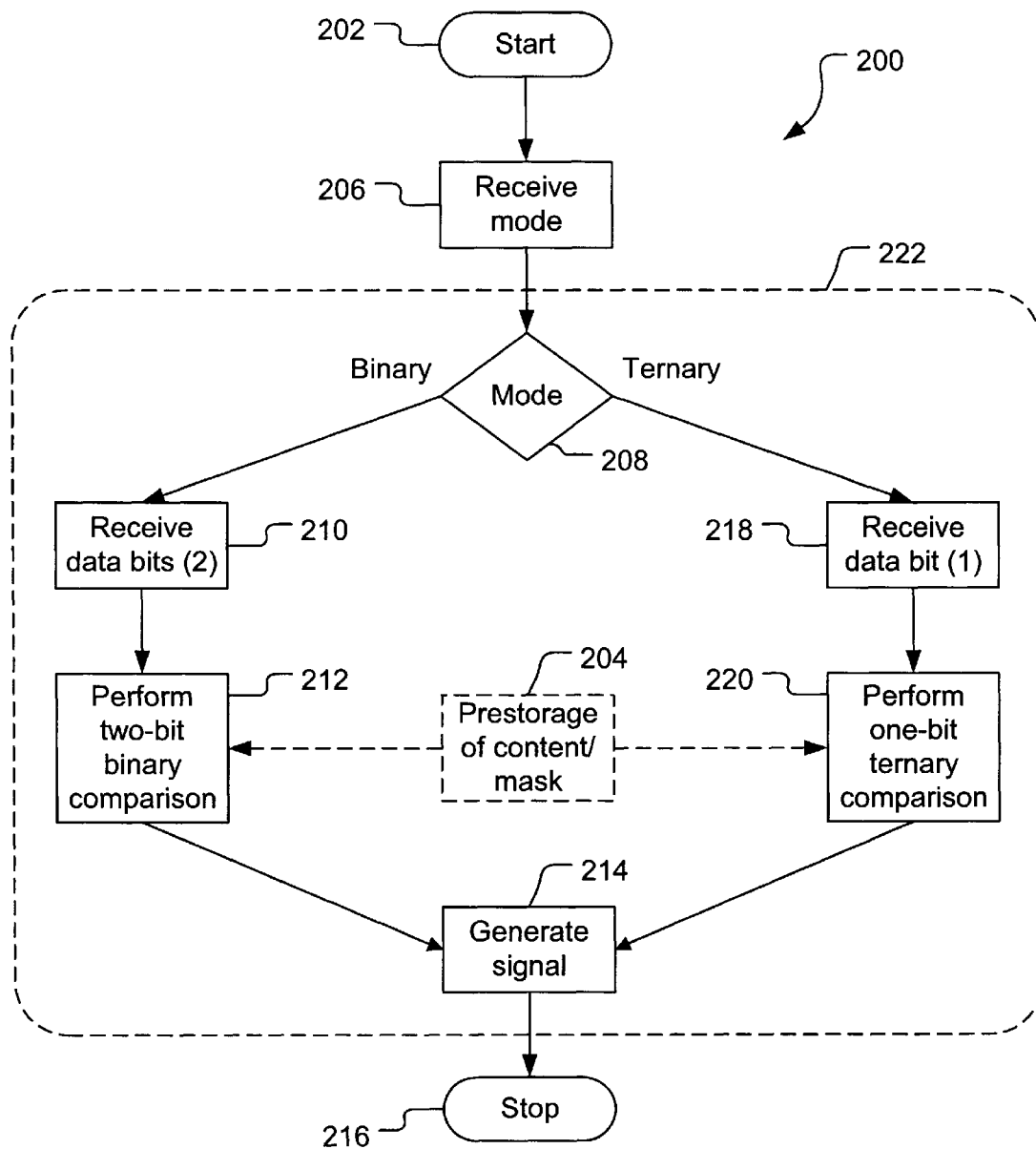
FIG. 6 is a flow chart depicting a selectable binary-ternary CAM operation method according to the present invention.

FIG. 6 is a flow chart depicting a selectable binary-ternary CAM operation method 200. Reference now also to FIG. 5 will be helpful. In a step 202 the method 200 starts. In a step 204 two content bits or one content bit and a mask bit are loaded into the storage locations 118 of a BT-CAM cell 114. In most embodiments this step 204 can occur before, contemporaneous with, or after step 206, as long as it occurs before the contents are used in step 210 or step 218.

In step 206 the mode of operation is received. Generally, this will be from outside of a BT-CAM unit 100, via a mode terminal 120 which connects to external circuitry. However, this need not be the case in all embodiments and, for example, the mode may also be set inside an integrated circuit embodiment of the BT-CAM unit 100, say, concurrent with programming PROM implementations of the storage locations 118.

In step 208 the received mode of operation determines what the subsequent steps will be. If a binary two-bit comparison is desired, step 210 follows. If a ternary one-bit comparison is desired, step 218 follows.

In step 210 two data bits are received from the input bus 110. Then, in step 212 a two-bit binary comparison is performed. In step 214 a result bit is generated, which appears as the bit signal 122 of the BT-CAM cell 114. In step 216 the method 200 is finished.

Alternately, in ternary mode, in step 218 one data bit is received from the input bus 110. Then, in step 220 a one-bit ternary comparison is performed. Again, as was the case for binary comparison, in step 214 the bit signal 122 is generated and in step 216 the method 200 is finished.

In FIG. 6 a block 222 emphasizes the parts of the method which occur in each BT-CAM cell 114. Of course, in modern CAM units thousands of cells are often employed. Thus, within individual BT-CAM units 100, the steps in block 222 may be employed on a data word received on the input bus 110. Such a data work can be compared against a content word (a comparand) stored in the storage locations 118 in such a group, or "bank" of the BT-CAM cells 114, or compared against both a pre-stored content word and a pre-stored mask word if a ternary comparison is desired.

In this manner such a bank of the BT-CAM cells 114 can generate a bank word, including bit signals for all of the BT-CAM cells 114 in the bank. The match detection block 106 can then determine from this bank word if a match has occurred, and generate an appropriate match signal 126. Typically, multiple such banks of BT-CAM cells 114 will be employed in an individual BT-CAM unit 100, and multiple match signals will be thus generated and directed to the priority encoder block 108 to produce a result signal at the result output 112 of the BT-CAM unit 100.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

INDUSTRIAL APPLICABILITY

The present BT-CAM unit 100 is well suited for application in many fields today. In general, the invention may be employed essentially wherever high speed data comparison is desired. Obviously, modem computational systems perform data comparison, often of different types and with varying amounts of frequency, and in many cases the invention is suited this.

The invention is particularly well suited for use in applications where it is desired to compare one comparand value against a large number of data values, either with direct or masked comparison. Perhaps the preeminent example of such an application today is network routing and switching, wherein data packet address information may constitute suitable comparand values and databases of control information (e.g., routing tables, filter tables, etc.) may constitute suitable data values to be compared against.

In this role the ability of the invention to operate in ternary mode is particularly advantageous, since appropriate use of mask data in ternary mode permits longest prefix type matching. In many network protocols, including TCP/IP which is essentially the lingua francia of the Internet, longest prefix matching is used to considerable extent.

The invention is also particularly well suited for use in applications where optimal resource usage is desired. The invention makes maximum cell usage in either binary or ternary modes, not wasting half the available memory cells in the manner which prior art ternary devices do when configured to operate in binary mode. This optimal resource usage can therefore be employed to make smaller, more powerful, or more energy efficient assemblies employing embodiments of the invention.

The invention is also particularly well suited for use when a reduced parts stock needs to be maintained. Since embodiments of the invention may be operated in either binary or ternary modes, these two different types of CAM need not stocked. Also, nothing in the principals of operation of the present invention particularly interferes with adding configuability features to devices using it, such as gating or multiplexing features to handle word-length configuability or subdividing to handle multiple-word comparisons in single devices concurrently.

The present invention is also currently and efficiently implimentable. It may be embodied using discrete components, as the principal element of integrated circuits or modules, or as a smaller element contributing to a higher function in much larger integrated circuits or modules. In all of these regards the invention maybe implemented using well known manufacturing techniques in various manufacturing families. For example, without limitation, in integrated circuit embodiments various logic families may be employed, providing speed, low energy usage, high temperature or radiation tolerance, etc. Considerable variation within embodiments of the invention are also possible. The storage locations used, for instance, may be static random access memory (SRAM); dynamic random access memory (DRAM); read only memory (ROM); and programmable read only memory (PROM collectively), such as basic PROM, erasable PROM (EPROM), electronically erasable and programmable PROM (EEPROM), and flash memory (arguably also a form of PROM).

The invention also requires no particular human skills. Once the teachings herein are appreciated, those of reasonable skill in the art can design and apply a wide variety of embodiments of the invention. It requires no particular new skills to implement designs using it, and employing embodiments of it is, at most, trivially more complex than utilizing prior art devices.

For the above, and other, reasons, it is expected that the BT-CAM unit 100 of the present invention will have widespread industrial applicability. Therefore, it is expected that the commercial utility of the present invention will be extensive and long lasting.

What is claimed is:

1. A content addressable memory (CAM), comprising:
   an input bus able to receive a data signal including a plurality of data bits;
   an array block having a plurality of CAM cells each including:
      a first storage location into which a content bit can be stored;
      a second storage location into which either a content bit or a mask bit can be stored;
      a comparator logic cell having inputs connected to each of said input bus, said first storage location, and said second storage location;
      said comparator logic cell being able to generate a bit signal based on comparison in two-bit binary manner of two said data bits and said content bits in each of said first storage location and said second storage location, when operation is desired in a binary mode; and
      said comparator logic cell further being able to generate said bit signal based on comparison in one-bit ternary manner of one said data bit with said content bit in said first storage location and said mask bit in said second storage location, when operation is desired in a ternary mode;
   a match detection block able to receive said bit signals from said array block and to generate there from a plurality of match signals; and
   a priority encoder block able to receive said plurality of match signals and to generate there from a result signal at a result output.

2. The CAM of claim 1, further comprising:
   a mode terminal also connected as an input to said comparator logic cell, to direct when operation is desired in said binary mode or said ternary mode.

3. The CAM of claim 1, further comprising:
   a mode terminal also connected as an input to said comparator logic cell and able to receive a mode signal from outside of the CAM, wherein said mode signal requests operation in said binary mode or said ternary mode.

4. The CAM of claim 1, wherein:
   at least one of said first storage location and said second storage location are static random access memory (SRAM).

5. The CAM of claim 1, wherein:
   said first storage location and said second storage location are members of the set consisting of dynamic random access memory (DRAM), read only memory (ROM), programmable read only memory (PROM), and flash memory.

6. The CAM of claim 1, wherein:
   when the CAM operates in said binary mode, said comparator logic cell compares a first said data bit with said first content bit in logical inverse exclusive "or" (XNOR) manner to produce a first intermediate result, compares a second said data bit with said first content bit also in logical XNOR manner to produce a second intermediate result, and combines said first intermediate result and second intermediate result in logical "and" (AND) manner to generate said bit signal; and
   when the CAM operates in said ternary mode, said comparator logic cell compares said first said data bit with said first content bit in logical XNOR manner to produce said first intermediate result, and combines said first intermediate result with said mask bit in logical AND manner to generate said bit signal.

7. A method for operating a content addressable memory (CAM) configurably in either of a binary operation mode or a ternary operation mode, the method comprising the steps of:
   (a) receiving a mode signal indicating whether the binary operation mode or the ternary operation mode is desired;
   (b) when said mode signal indicates the binary operation mode is desired:
      (1) receiving a first data bit and a second data bit from a data signal; and
      (2) comparing said first data bit to a first-part content bit previously stored in said first storage location and comparing said second data bit to a second-part content bit previously stored in said second storage location, thereby performing a two-bit binary comparison;
      (3) generating a bit signal based on said two-bit binary comparison; and
   (c) when said mode signal indicates the ternary operation mode is desired:
      (1) receiving said first data bit from said data signal;
      (2) comparing said first data bit to a content bit previously stored in said first storage location based on a mask bit previously stored in said second storage location, thereby instead performing a one-bit ternary comparison; and
      (3) generating said bit signal based on said one-bit ternary comparison.

8. The method of claim 7, wherein:
   steps (a) through (c) occur in a bank of CAM cells each respectively having one said first storage location and one said second storage location; and
   if the binary operation mode is desired:
      in said step (b)(1) a data word is received from said data signal, wherein said data word consists of a plurality of said data bits;
      in said step (b)(2) said data word is compared with a content word consisting of a plurality of said first-part content bits and a plurality of said second-part content bits which have previously been stored in said bank of CAM cells; and
      in said step (b)(3) a bank word is generated, wherein said bank word consists of a plurality of said bit signals and represents a two-bit binary comparison of said data word with said content word; and
   if the ternary operation mode is desired:
      in said step (c)(1) a data word is received from said data signal, wherein said data word consists of a plurality of said data bits;
      in said step (c)(2) said data word is compared with a content word consisting of a plurality of said content bits and a mask word consisting of a plurality of said mask bits which have previously been stored in said bank of CAM cells; and
      in said step (c)(3) a bank word is generated, wherein said bank word consists of a plurality of said bit signals and represents a one-bit ternary comparison of said data word with said content word.

9. The method of claim 8, further comprising:

(d) generating a match signal based on said bank word.

10. The method of claim 9, further comprising:

(e) generating a result signal based on a plurality of said bank words.

11. A content addressable memory (CAM) cell, comprising:

a first storage location into which a content bit can be stored;

a second storage location into which either a content bit or a mask bit can be stored;

a comparator logic cell having inputs connected to each of a mode terminal, two input lines, said first storage location, and said second storage location;

when operation in a binary mode is requested via said mode terminal, said comparator logic cell being able to generate a bit signal based on comparison in two-bit binary manner of two data bits, respectively received via said two input lines, with said content bits in each of said first storage location and said second storage location; and when operation in a ternary mode is requested via said mode terminal, said comparator logic cell further being able to generate said bit signal based on comparison in one-bit ternary manner of one said data bit, received via one of said two input lines, with said content bit in said first storage location and said mask bit in said second storage location.

12. The CAM cell of claim 11, wherein:

at least one of said first storage location and said second storage location are static random access memory (SRAM).

13. The CAM cell of claim 11, wherein:

said first storage location and said second storage location are members of the set consisting of dynamic random access memory (DRAM), read only memory (ROM), programmable read only memory (PROM), and flash memory.

14. The CAM cell of claim 11, wherein:

when the CAM cell operates in said binary mode, said comparator logic cell compares a first said data bit with said first content bit in logical inverse exclusive "or" (XNOR) manner to produce a first intermediate result, compares a second said data bit with said first content bit also in logical XNOR manner to produce a second intermediate result, and combines said first intermediate result and second intermediate result in logical "and" (AND) manner to generate said bit signal; and when the CAM cell operates in said ternary mode, said comparator logic cell compares said first said data bit with said first content bit in logical XNOR manner to produce said first intermediate result, and combines said first intermediate result with said mask bit in logical AND manner to generate said bit signal.

\* \* \* \* \*